United States Patent
Tullidge et al.

(10) Patent No.: US 7,193,863 B2
(45) Date of Patent: Mar. 20, 2007

(54) ELECTRONICS PACKAGING ASSEMBLY WITH PARALLEL CIRCUIT BOARDS AND A VIBRATION STIFFENER

(75) Inventors: Lee H. Tullidge, Urbana, OH (US); William M. Tillinghast, Dayton, OH (US)

(73) Assignee: Honeywell International Inc., Morris Township, NJ (US)

( * ) Notice: Subject to any disclaimer, the term of this patent is extended or adjusted under 35 U.S.C. 154(b) by 0 days.

(21) Appl. No.: 11/043,931

(22) Filed: Jan. 28, 2005

(65) Prior Publication Data

US 2006/0171132 A1 Aug. 3, 2006

(51) Int. Cl.
*H05K 7/14* (2006.01)
*H05K 7/18* (2006.01)

(52) U.S. Cl. .............. 361/801; 361/747; 361/754; 361/759

(58) Field of Classification Search .......... 361/607, 361/609, 615, 625, 683, 725, 732, 740, 747, 361/754, 759, 798, 801, 802, 752, 797
See application file for complete search history.

(56) References Cited

U.S. PATENT DOCUMENTS

| | | | |
|---|---|---|---|
| 3,404,785 A * | 10/1968 | Emary ................. | 211/183 |
| 3,479,568 A | 11/1969 | Shapiro et al. | |
| 3,691,430 A | 9/1972 | Freitag | |
| 3,762,574 A | 10/1973 | Bentley et al. | |
| 3,764,857 A | 10/1973 | Bartlett et al. | |
| 3,863,113 A | 1/1975 | Ward | |
| 4,151,580 A | 4/1979 | Struger et al. | |
| 4,232,356 A * | 11/1980 | Saunders et al. ......... | 361/797 |
| 4,430,691 A * | 2/1984 | Rea ..................... | 361/704 |
| 4,503,484 A | 3/1985 | Moxon | |
| 4,542,341 A * | 9/1985 | Santomango et al. ...... | 324/760 |
| 4,546,414 A | 10/1985 | Donges | |
| 4,553,674 A * | 11/1985 | Yoshikawa et al. ....... | 211/26 |
| 4,558,398 A * | 12/1985 | Drake .................. | 361/797 |
| 4,657,146 A * | 4/1987 | Walters ............... | 211/41.17 |
| 5,227,958 A | 7/1993 | Glomski et al. | |
| 5,313,369 A * | 5/1994 | Lewis et al. ........... | 361/796 |
| 5,390,083 A | 2/1995 | Decker et al. | |
| 5,398,164 A * | 3/1995 | Goodman et al. ........ | 361/752 |
| 5,477,420 A | 12/1995 | Brooks | |
| 5,544,006 A * | 8/1996 | Radloff et al. .......... | 361/683 |
| 5,708,563 A | 1/1998 | Cranston, III et al. | |

(Continued)

*Primary Examiner*—Tuan Dinh
*Assistant Examiner*—Hung S. Bui
(74) *Attorney, Agent, or Firm*—Birch, Stewart, Kolasch & Birch, LLP

(57) ABSTRACT

An electronics packaging assembly (100) includes: an assembly housing (120); a plurality of printed circuit boards (110; 210) arranged in parallel within the assembly housing (120); and a vibration stiffener (140; 240). The printed circuit boards (110; 210) each have a notch (112; 212) on one edge. The vibration stiffener (140; 240) is arranged within the assembly housing (120) along a lateral direction relative to the plurality of printed circuit boards (110; 210) and includes a plurality of slots (142; 242) that engage with corresponding notches (112; 212) of the plurality of printed circuit boards (110; 210), wherein engagement of the vibration stiffener (140; 240) with the plurality of printed circuit boards (110; 210) limits flexing of the printed circuit boards (110; 210) in the lateral direction. In one implementation, a portion of the assembly housing (120) contacts and applies pressure to the vibration stiffener (140; 240) to keep the vibration stiffener (140; 240) in place.

10 Claims, 3 Drawing Sheets

U.S. PATENT DOCUMENTS

| | | | |
|---|---|---|---|
| 5,715,146 A * | 2/1998 | Hoppal | 361/796 |
| 5,751,559 A | 5/1998 | Jensen et al. | |
| 5,822,193 A | 10/1998 | Summers et al. | |
| 5,841,638 A | 11/1998 | Purdom et al. | |
| 5,963,432 A | 10/1999 | Crowley | |
| 5,969,953 A | 10/1999 | Purdom et al. | |
| 6,014,319 A * | 1/2000 | Kuchta et al. | 361/788 |
| 6,049,449 A | 4/2000 | Cranston, III et al. | |
| 6,220,887 B1 * | 4/2001 | Downs | 439/377 |
| 6,343,020 B1 * | 1/2002 | Lin et al. | 361/816 |
| 6,385,050 B1 | 5/2002 | Orita et al. | |
| 6,385,053 B1 | 5/2002 | Parizi et al. | |
| 6,407,926 B1 | 6/2002 | Walker et al. | |
| 6,411,521 B1 | 6/2002 | Nikmanesh | |
| 6,418,034 B1 | 7/2002 | Weber et al. | |
| 6,535,394 B1 | 3/2003 | Hirzmann | |
| 6,574,116 B2 | 6/2003 | Moriwaki et al. | |
| 6,711,030 B2 | 3/2004 | Akiba | |
| 6,760,229 B2 * | 7/2004 | Roscoe et al. | 361/752 |
| 2002/0034068 A1 | 3/2002 | Weber et al. | |
| 2003/0030997 A1 | 2/2003 | Mizusaki | |

* cited by examiner

ELECTRONICS PACKAGING ASSEMBLY WITH PARALLEL CIRCUIT BOARDS AND A VIBRATION STIFFENER

FIELD OF THE INVENTION

The present invention relates to electronics assemblies, and more particularly to an electronics packaging assembly having a plurality of parallel circuit boards and a vibration stiffener for providing vibration support to the circuit boards.

BACKGROUND OF THE INVENTION

A known type of electronics assembly includes multiple printed circuit boards (PCBs) that are arranged and mounted side-by-side, in parallel. The PCBs have an electrical connector on one edge so as to plug into slots of a motherboard for electrical connection, such that each PCB extends away from the motherboard perpendicularly. Factors including PCB dimensions, rigidity, and proximity to other elements (e.g., the density of multiple PCBs) render such an assembly susceptible to damage, particularly in high vibration environments. Vibrations can cause the PCBs to flex, to the extent that the PCBs crack, components loosen or pop off, the conductive pattern is damaged, and/or adjacent PCBs come into contact.

One technique for stabilizing a plurality of parallel PCBs, disclosed in U.S. Pat. No. 5,822,193 to Summers et al., uses a rigid cross member and circuit board clamp arrangement. Each circuit board clamp extends along one surface of a corresponding circuit board and has hooks that attach to opposite ends of the circuit board. Each circuit board clamp is connected on one end to the rigid cross member to prevent flexing. Such an arrangement, however, requires space to accommodate the circuit board clamps, thereby limiting package density. Furthermore, such an arrangement is not readily adaptable to various packaging designs, and would add considerable weight, which is particularly undesirable in avionics/aerospace applications.

SUMMARY OF THE INVENTION

The present invention relates to an electronics packaging assembly. In one embodiment of the present invention, the electronics packaging assembly comprises: an assembly housing; a plurality of circuit boards arranged in parallel within the assembly housing, the circuit boards each having a notch on one edge; and a vibration stiffener arranged within the assembly housing along a lateral direction relative to the plurality of circuit boards. The vibration stiffener includes a plurality of slots that engage with corresponding notches of the plurality of circuit boards, wherein engagement of the vibration stiffener with the plurality of circuit boards limits flexing of the printed circuit boards in the lateral direction.

BRIEF DESCRIPTION OF THE DRAWINGS

Additional aspects of the present invention will become apparent from the Detailed Description, taken in conjunction with the attached drawing sheets in which.

DETAILED DESCRIPTION

Figure 1A:
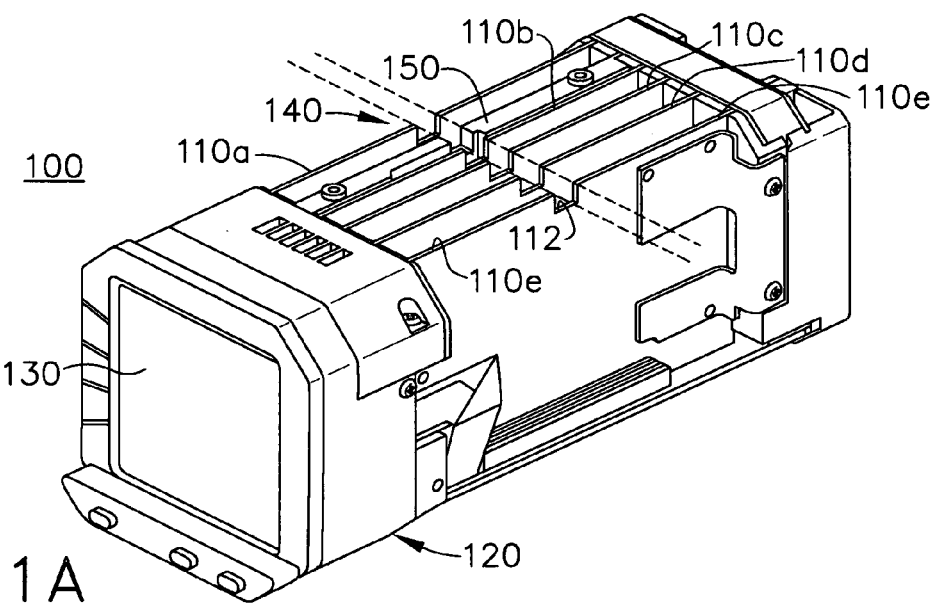
FIG. 1A is a perspective view of an electronics packaging assembly according to an embodiment of the present invention.
Figure 1B:
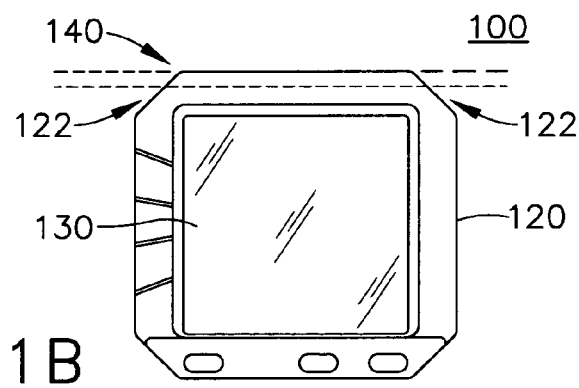
FIG. 1B is a front view of the electronics packaging assembly illustrated in FIG. 1A.

In one aspect, the present invention is an electronics packing assembly having a plurality of parallel printed circuit boards (PCBs) and a vibration stiffener, which includes a plurality of slots. Slots of the vibration stiffener engage with corresponding notches formed in the PCBs to provide vibration support. The vibration stiffener limits the flex of each PCB and prevents adjacent PCBs from touching, even when densely packaged. FIG. 1A is a perspective view of an electronics packing assembly in accordance with one embodiment of the present invention. The electronics packaging assembly of FIG. 1A is a display assembly 100, e.g., for use as a display in an aerospace/avionics environment such as a helicopter. The electronics packing assembly 100 includes: a plurality of parallel PCBs 110a–110e; a housing 120; a display screen 130; and a vibration stiffener 140. The assembly 100 includes a support element 150, positioned between parallel PCBs 110a and 110b, for support along the plane parallel to the PCBs 110a–110e. Depending on the application/assembly, this support element may not be present. FIG. 1B is a front view, showing the positioning of vibration stiffener 140 with respect to the top of the housing 120. In both FIGS. 1A and 1B, the length of the vibration stiffener 140 (shown with a dashed line) is exaggerated for ease of illustration. In actual implementation, the length of the vibration stiffener 140 is less than the width dimension of the electronics assembly 100 so as to be contained within the housing 120. For the particular housing 120 illustrated in FIG. 1A, the ends of the vibration stiffener 140 may be angled to conform to angled sections 122 of the housing 120.

Figure 1C:
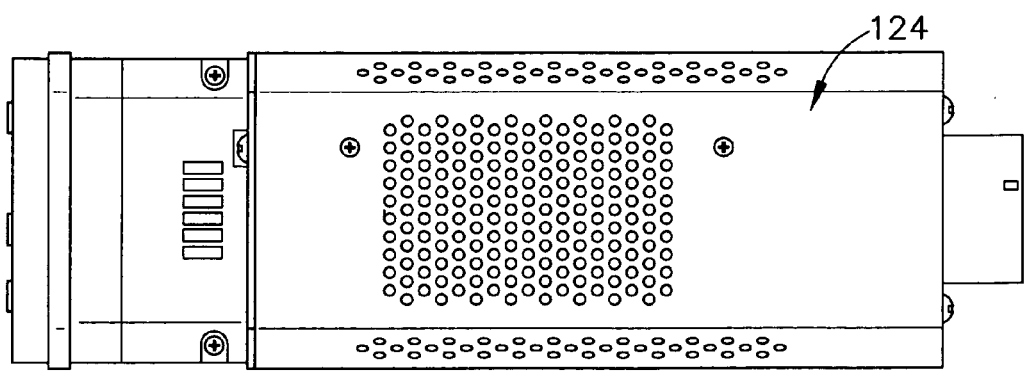
FIG. 1C is a top view of the electronics packaging assembly of FIG. 1A, with a housing cover in place, in accordance with an embodiment of the present invention.

FIG. 1C is a top view of the electronics assembly 100, with a housing cover 124 in place. The height dimension of the vibration stiffener 140 may be adapted to fill space between the top of the PCBs 110a–110e and the housing cover 124. In this way, in accordance with one implementation of the present invention, the top of the vibration stiffener 140 abuts a surface of the housing cover 124 so that the housing cover 124 exerts downward pressure on the vibration stiffener 140, thereby keeping the vibration stiffener 140 in place and functioning to restrict movement of PCBs 110a–110e. With this arrangement, it is not necessary to secure the vibration stiffener 140 to the housing 120, although the vibration stiffener 140 may be attached to the housing 120, for example using a screw, in certain applications to provide additional support.

The shape and dimensions of the vibration stiffener 140 are adaptable to different housing configurations that contain parallel PCBs and require lateral vibration support. The vibration stiffener 140 may be formed of various materials, such as aluminum, polycarbonate, nylon, or Teflon. In one implementation, the vibration stiffener 140 is electrically isolated from conductive components of the PCBs 110a–110e. It is noted, however, that the vibration stiffener 140 could be used for grounding or electrical connection between PCBs (e.g., by placing conductive paths where the vibration stiffener contacts the PCBs 110a–110e). Also, the vibration stiffener 140 could function as a heat sink.

Figure 2:
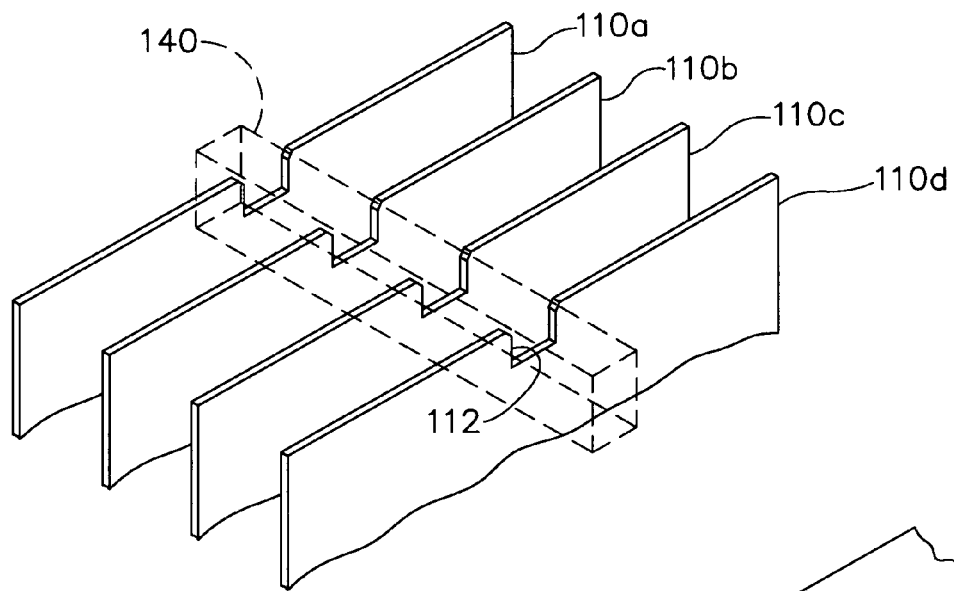
FIG. 2 illustrates an arrangement of parallel printed circuit boards engaged with a lateral vibration stiffener in accordance with an embodiment of the present invention.
Figure 3:
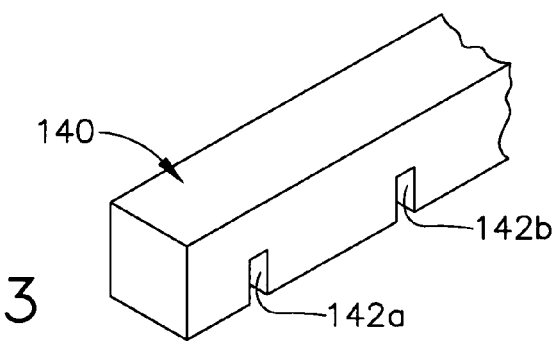
FIG. 3 illustrates the vibration stiffener used in the electrical assembly of FIG. 1A in accordance with an embodiment of the present invention.
Figure 4:
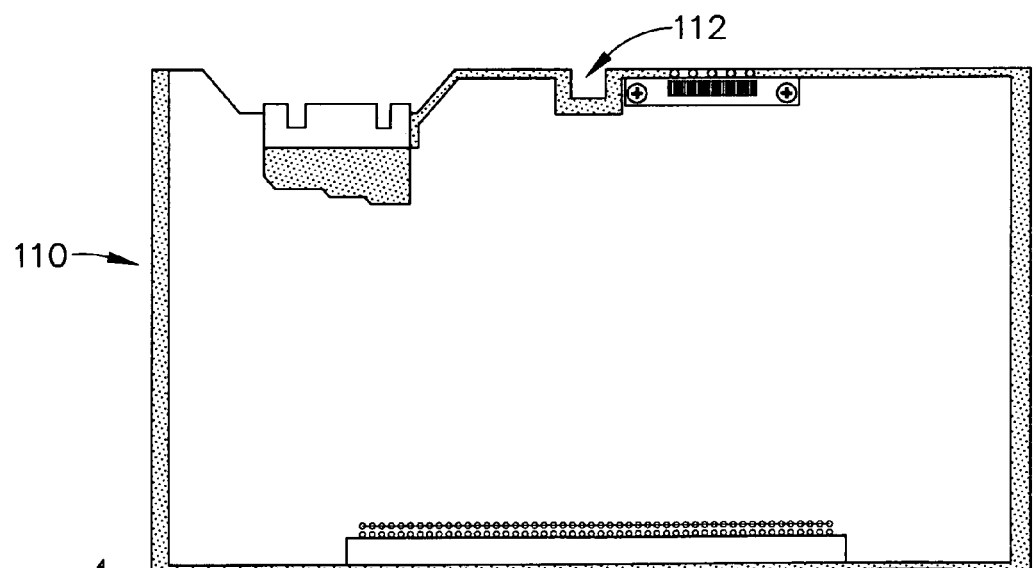
FIG. 4 illustrates a printed circuit board used in the electronics assembly of FIG. 1A in accordance with an embodiment of the present invention.

FIG. 2 illustrates the use of vibration stiffener 140 providing lateral vibration support for a plurality of PCBs 110a–110d. FIG. 3 illustrates a vibration stiffener 140 in accordance with one embodiment of the present invention. FIG. 4 illustrates a PCB 110 in accordance with one embodiment of the present invention. As shown in these Figures, each PCB 110 includes a notch 112, which engages with a slot 142a, 142b, . . . of the vibration stiffener 140. When engaged, the slots 142 in the vibration stiffener 140 and the notches in the PCBs 110 function similar to a dovetail or finger joint, restricting the PCBs laterally and retaining the vibration stiffener 140 in place.

A slot 142 in the vibration stiffener 140 and the corresponding notch 112 in the PCB 110 can be of varying size and shape to accommodate differences in design requirements, e.g., based on vibration specification requirements, PCB thickness, electrical and thermal considerations, available space on the PCB 110, and stiffener material requirements (e.g., dictated by weight restrictions). Furthermore, the slots 142 and corresponding notches 112 may be keyed to prevent improper ordering of the PCBs 110a–110e.

Figure 5A:
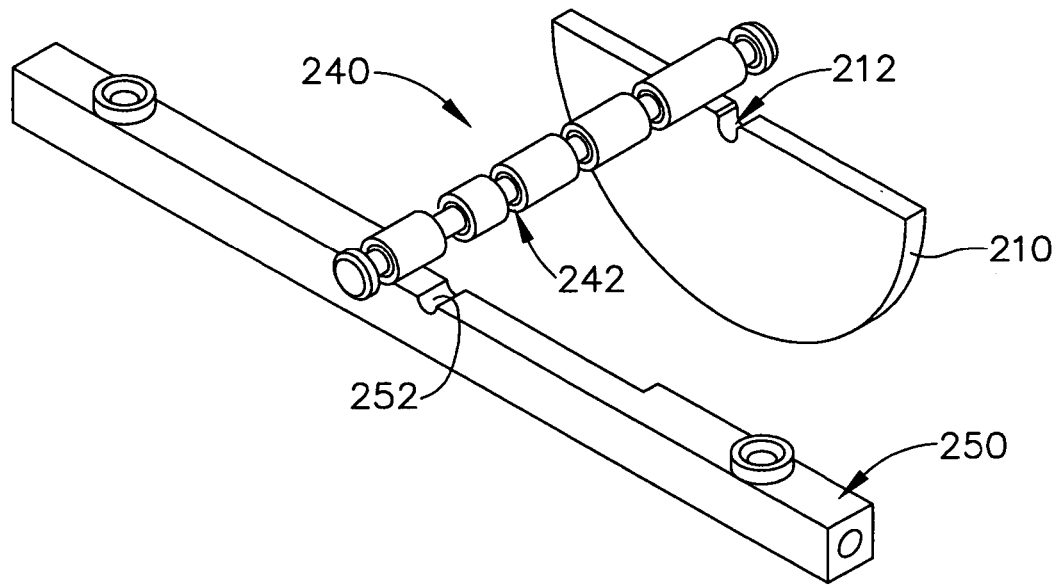
FIG. 5A is an exploded view of a vibration stiffener arrangement for parallel printed circuit boards in accordance with an alternative embodiment of the present invention.
Figure 5B:
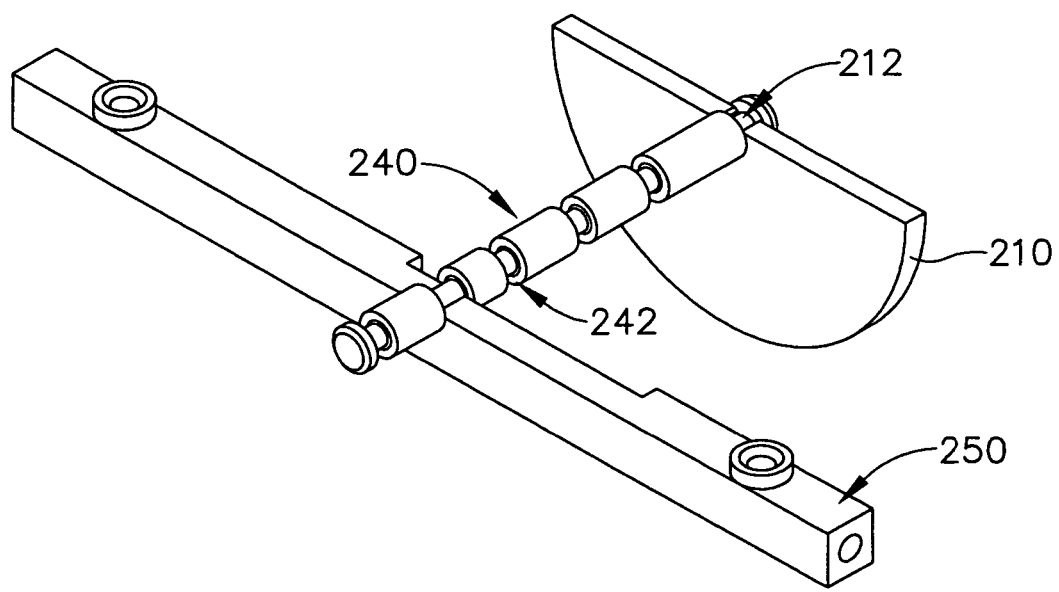
FIG. 5B illustrates the vibration stiffener arrangement of FIG. 5A as assembled.

FIG. 5A is an exploded view of a vibration stiffener/PCB arrangement in accordance with an alternative embodiment of the present invention. FIG. 5B illustrates such an arrangement as assembled. In this arrangement, the vibration stiffener 240 is round, with slots 242 formed as alternating smaller diameter regions 242 that each engage with a corresponding notch 212 of a PCB 210. Only one PCB 210 is illustrated in FIGS. 5A and 5B for each of illustration. In this alternative embodiment, the vibration stiffener 240 includes a slot 242 that engages with a notch 252 of a support element 250. As in the embodiment illustrated in FIGS. 1A–C, the vibration stiffener 240 may be positioned and/or dimensioned to contact with the housing cover 124, so that the housing cover 124 exerts additional downward pressure on the PCBs 210 at assembly. This arrangement provides multi-axis support.

Although aspects of the present invention have been described in the context of a particular type of electronics apparatus, it should be understood that principles of the present invention are applicable to other electronics assemblies that incorporate the plurality of parallel circuit boards.

We claim:
1. An electronics packaging assembly comprising:
an assembly housing;
a plurality of circuit boards arranged in parallel within said assembly housing, said circuit boards each having a notch on one edge;
a vibration stiffener arranged within said assembly housing along a lateral direction relative to said plurality of circuit boards, said vibration stiffener including a plurality of slots that engage with corresponding notches of said plurality of circuit boards, wherein engagement of said vibration stiffener with said plurality of circuit boards limits flexing of said circuit boards in said lateral direction, such that said vibration stiffener extends along a direction transverse to said plurality of parallel circuit boards and by engaging with said plurality of parallel circuit boards stabilizes said plurality of parallel circuit boards along an axis that is transverse to said plurality of parallel circuit boards; and
wherein said assembly housing includes a cover, a surface of which abuts said vibration stiffener, such that said cover exerts pressure on said vibration stiffener to maintain firm engagement between said vibration stiffener and said plurality of circuit boards.

2. The electronic packaging assembly of claim 1, wherein said vibration stiffener is not secured to said assembly housing.

3. The electronics packaging assembly of claim 1, wherein said vibration stiffener is secured to said assembly housing.

4. The electronics packaging assembly of claim 1, wherein said notches of said plurality of circuit boards are positioned where maximum lateral flex occurs during vibration.

5. The electronics packaging assembly of claim 1, wherein said assembly is for use in aerospace/avionics applications.

6. The electronics packaging assembly of claim 1, wherein said vibration stiffener has a square-shaped or rectangular-shaped cross-section.

7. The electronics packaging assembly of claim 1, wherein said vibration stiffener has a circular-shaped cross-section.

8. The electronics packaging assembly of claim 1, wherein said vibration stiffener is electrically isolated from conductive components of said printed circuit boards.

9. The electronics packaging assembly of claim 1, wherein said vibration stiffener also functions as an electrical grounding element or an electrical connection between printed circuit boards.

10. The electronics packaging assembly of claim 1, wherein said vibration stiffener also functions as a heat sink.

* * * * *